(12) United States Patent
Salvisberg et al.

(10) Patent No.: US 11,169,231 B2
(45) Date of Patent: Nov. 9, 2021

(54) NMR PROBE HEAD WITH PIEZOELECTRIC ACTUATORS

(71) Applicant: QONETEC AG, Dietlikon (CH)

(72) Inventors: Samuel Salvisberg, Winterthur (CH); Marco Osterwalder, Wetzikon (CH)

(73) Assignee: QONETEC AG, Dietlikon (CL)

( * ) Notice: Subject to any disclaimer, the term of this patent is extended or adjusted under 35 U.S.C. 154(b) by 0 days.

(21) Appl. No.: 16/766,331

(22) PCT Filed: Nov. 23, 2017

(86) PCT No.: PCT/CH2017/000097
§ 371 (c)(1),
(2) Date: May 22, 2020

(87) PCT Pub. No.: WO2019/100173
PCT Pub. Date: May 31, 2019

(65) Prior Publication Data
US 2020/0371176 A1     Nov. 26, 2020

(51) Int. Cl.
*G01R 33/00* (2006.01)
*G01R 33/36* (2006.01)
*G01R 33/34* (2006.01)

(52) U.S. Cl.
CPC ..... *G01R 33/3635* (2013.01); *G01R 33/3403* (2013.01)

(58) Field of Classification Search
CPC .............. G01R 33/543; G01R 33/5608; G01R 33/4828; G01R 33/3415; G01R 33/283; G01R 33/307; G01R 33/60; G01R 33/3635; G01R 33/3403; G01V 3/32; E21B 49/08; G01N 24/10
See application file for complete search history.

(56) References Cited

U.S. PATENT DOCUMENTS

| | | | |
|---|---|---|---|
| 4,602,213 A | 7/1986 | Sugiura | |
| 4,694,255 A | 9/1987 | Hayes | |
| 4,890,062 A | 12/1989 | Haragashira | |
| 5,842,154 A | 11/1998 | Harnett | |
| 6,204,665 B1 * | 3/2001 | Triebe | G01R 33/28 324/318 |
| 6,323,647 B1 | 11/2001 | Anderson et al. | |

(Continued)

FOREIGN PATENT DOCUMENTS

| | | |
|---|---|---|
| WO | 2005/083874 | 9/2005 |
| WO | 2005/083874 A1 | 9/2005 |
| WO | 2009/094040 A1 | 7/2009 |

OTHER PUBLICATIONS

ISR for International Application PCT/CH2017/000097.
(Continued)

*Primary Examiner* — Patrick Assouad
*Assistant Examiner* — Taqi R Nasir
(74) *Attorney, Agent, or Firm* — Ladas & Parry LLP

(57) ABSTRACT

The NMR probe head comprises a base and a tube. A coil is arranged in the tube. A tuning and matching circuit is also arranged in the tube adjacent to the coil. The coil and/or the tuning and matching circuit comprise several tunable elements. Several actuators are arranged in the tube for actuating the tunable elements. The actuators are located in in a compact actuator assembly.

31 Claims, 3 Drawing Sheets

(56) References Cited

U.S. PATENT DOCUMENTS

| | | | |
|---|---|---|---|
| 6,605,944 B2* | 8/2003 | Engelke | G01R 33/3628 |
| | | | 324/307 |
| 7,061,745 B2 | 6/2006 | Funk et al. | |
| 2008/0117560 A1 | 5/2008 | Finnigan | |
| 2014/0167756 A1 | 6/2014 | Cho et al. | |
| 2014/0253124 A1* | 9/2014 | Baumann | G01R 33/30 |
| | | | 324/322 |

OTHER PUBLICATIONS

Written Opinion for International Application PCT/CH2017/000097.

Z. Li et al., "Automation system based on piezoelectric motor for tuning and matching miniature monolithic NMR coils", Proceedings of the International Society for Magnetic Resonance in Medicine, No. 4830, Apr. 28, 2014 (Apr. 28, 2014), p. 4830, XP040671603.

G. A. Keith et al., "Computerized Tuning of an 8-channel Cardiac TEM Array at 7 T: an Integrated System Using Piezoelectric Actuators and Power Monitors", Proceedings of the International Society for Magnetic Resonance in Medicine, 21st Annual Meeting & Exhibition, Apr. 7, 2013 (Apr. 7, 2013), p. 2734, XP040630339.

Li Zhoujian, et al., Automation system based on piezoelectric motor for tuning and matching miniature monolithic NMR coils, Proc. Intl. Soc. Mag. Reson. Med. 22 (2014).

\* cited by examiner

NMR PROBE HEAD WITH PIEZOELECTRIC ACTUATORS

RELATED APPLICATION

This application is an application under 35 U.S.C. 371 of International Application No. PCT/CH2017/000097 filed on 23 Nov. 2017, the entire content of which are incorporated herein by reference.

TECHNICAL FIELD

The invention relates to an NMR probe head as well as to a method for operating the same.

BACKGROUND ART

In NMR probing, a sample is placed in a strong, static magnetic field. At least one coil is arranged around a sample chamber to receive the sample. It is used to generate a dynamic magnetic field perpendicular to the static magnetic field, which causes nuclear spins in the sample to precess about the static field. This precession can be recorded by the coil.

A tuning and matching circuit is typically arranged close to the coil and has the purpose to tune the resonance of the coil and to match the impedance to avoid reflections of the power signals.

Typically, the tuning and matching circuit and/or the coil have several mechanically tunable elements, such as mechanically adjustable capacitors or electrical switches in order to tune and match its properties to the frequencies to be used.

The coil as well as the tuning and matching circuit are typically arranged within a tube, which is mounted onto a base. The base has a larger diameter than the tube. The tube is inserted into a central opening of a strong magnet while the base is arranged outside the magnet.

Actuators are required for operating the tunable elements in the tuning and matching circuit and/or the coil. Typically, they are implemented as manually operatable gears and/or electric motors arranged in the base.

DISCLOSURE OF THE INVENTION

The problem to be solved by the present invention is to provide an NMR probe head of the type above that provides a reliable and simple tuning and as matching of the tunable elements in the tuning and matching circuit and/or in the coil.

This problem is solved by the NMR probe head of claim 1. Accordingly, the probe head comprises the following components:

- A base: This part of the probe head is typically located outside the magnet.
- A tube having a diameter smaller than the base: The tube is typically inserted into the magnet.
- A coil arranged within the tube and surrounding a sample chamber: This is the coil that generates the high frequency magnetic fields for manipulating the sample and that picks up the signals of the precessing spins. Depending on the type of NMR probe, there may be one or more of said coils. The coils can include simple coils, birdcage coils, and other types of NMR coil geometries known to the skilled person.
- A tuning and matching circuit arranged within the tube and connected to the coil: This circuit is provided for tuning and matching the signals to the used frequencies.
- Several tunable elements arranged in the tuning and matching circuit and/or the coil: These are used for tuning and/or matching the coil and circuit to the used signals. The tunable elements can e.g. comprise adjustable capacitors, adjustable inductances, and/or electric switches.
- Several actuators mechanically connected by means of actuation members to the tunable elements: The actuators are used for operating the tunable elements, and the actuation members transmit the actuators' movements to the tunable elements.

According to the invention, at least some of the actuators are piezoelectric actuators. Such actuators can be easily and quickly adjusted. In particular, they can have high accuracy, they do not require gears or transmissions, they are able to operate in high magnetic fields, and they can be fast.

In particular, a plurality of the actuators are piezoelectric actuators, or even all the actuators are piezoelectric actuators.

At least one of the actuation members can be an actuation rod extending between the actuator and its tunable element. Advantageously, all the actuation members are such actuation rods.

Advantageously, the actuators are located, in particular completely located, within the tube between the base and the tuning and matching circuit, i.e. outside the base itself. This allows using shorter actuation members, which in turn reduces their weight and allows for faster and more accurate actuation.

In a preferred embodiment, at least one of the actuators, advantageously all of the actuators, comprises the following components:

- A mount fixedly arranged in respect to the tube: In other words, the mount does not move in respect to the tube when the actuator is actuated.
- At least one driving rod elastically mounted on the mount: In this context, "elastically" is advantageously understood such that the driving rod can be elastically displaced by at least 0.1 µm, in particular 1 µm, in particular by at least 10 µm, but advantageously by no more than 200 µm, in respect to the mount by means of the piezoelectric element described in the next paragraph.
- At least one piezoelectric element mounted to the driving rod: This element can e.g. be operated to generate asymmetric, cyclic, e.g. sawtooth-type, back-and-forth axial motions in the driving rod.
- A slip coupler arranged on the driving rod, wherein at least one of the actuation members is connected to the slip coupler: In this context, a slip coupler is a coupler that is frictionally held on the driving rod. The friction force advantageously is selected such that, when the driving rod performs its cycles of asymmetric back-and-forth axial motions, during a first part each cycle (when acceleration is above a certain threshold) the coupler slips against the driving rod while, during a second part of each cycle (when acceleration is low) the coupler is frictionally locked on the driving rod.

This design allows to decouple the design of the driving rod and the actuation member and to optimize each one of them for their respective task. In particular, the driving rod can be lighter, in particular shorter, than the actuation members, which reduces the mass of the oscillating parts.

In particular, the actuator can be adapted and structured to displace the actuation member in respect to the piezoelectric element. Hence, the piezoelectric element can be located at a fixed position, while only the actuation member is moved, which further reduces the mass of the moved components and allows for faster adjustments.

Advantageously, the NMR probe head comprises an actuator assembly that in turn comprises several of said actuators. The actuator assembly has a frame commonly holding the actuators. In other words, the actuators are mounted to a common frame. This allows for a more compact design and easier manufacturing.

In particular, the frame can comprise a first frame body having a plurality of recesses or openings. Each driving rod is held in at least one of the recesses or openings. This allows for an even more compact design.

For improved stability, the frame can comprise a second frame body arranged at a distance from the first frame body, with the driving rods of the actuators extending between the two frame bodies The frame body (i.e. the first frame body and/or the second frame body, if any) can be a plate extending transversally, in particular perpendicularly, to the axis of the tube, and the recesses or openings for receiving the driving rods can be arranged at a periphery of the frame body. This simplifies the mounting of the piezoelectric actuators in the actuator assembly.

The tunable elements can e.g. comprise adjustable capacitors, adjustable inductors, and/or electric switches.

The invention also relates to a method for operating such a probe head. This method comprises the step of operating at least one of the actuators to displace the actuation member connected to it along a first direction for a given number of steps. This given number of steps is sufficiently large to ensure that the actuation member is stopped by a mechanical stop. The respective position is called "end position". This allows bringing the actuation rod into a defined position (the end position) without having to rely on a position sensor.

Advantageously, the method further comprises the step of operating the one actuator to move the actuation member, after executing the given number of steps, from said end position into a second direction opposite the first direction for a second number of steps of the piezoelectric actuator for reaching a desired position. In other words, once the end position has been established, the actuation rod can be moved into any desired position by applying the adequate number of oscillations to the piezoelectric actuator.

In yet another advantageous embodiment, the method comprises the following steps:
  Measuring the magnitude and phase of an AC signal being fed to the tuning and matching circuit.
  Determining, from said magnitude and phase, a direction for displacing at least one of said actuation members, in particular using fuzzy logic This is based on the understanding that the combined measurement of the amplitude and phase allows to determine the direction of movement required for the actuation member and therefore to adjust the adjustable elements more quickly.

In this context, "amplitude and phase" expresses any pair of real-valued numbers allowing to calculate the amplitude and phase of the AC signal, and the term includes an explicit determination of these two values or an implicit determination, e.g. by means of the real and imaginary parts of the signal when representing the signal as a complex number.

The method described herein can be implemented by a control unit that is structured and adapted to carry out the respective steps.

BRIEF DESCRIPTION OF THE DRAWINGS

The invention will be better understood and objects other than those set forth above will become apparent when consideration is given to the following detailed description thereof. This description makes reference to the annexed drawings, wherein.

MODES FOR CARRYING OUT THE INVENTION

Figure 1:
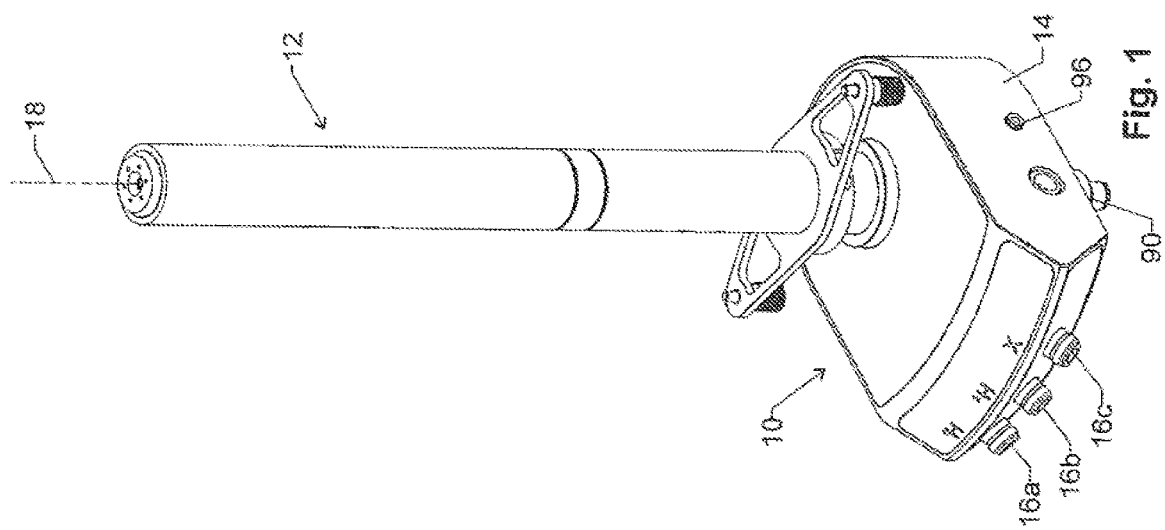
FIG. 1 shows a view of an NMR probe head.
Figure 4:
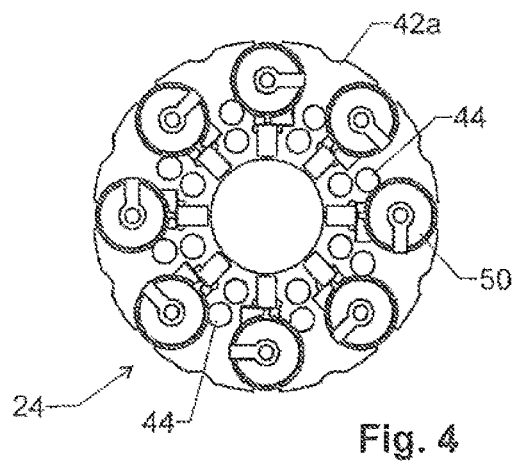
FIG. 4 shows a view of the actuator assembly of the probe head of FIG. 2 along the tube axis of the tube.

Overview:

The NMR probe head of FIG. 1 comprises a base 10 and a tube 12.

Base 10 comprises a housing 14 for receiving electronic circuitry as well as an electric interface 16a, 16b, 16c suitable feeding various signals to the probe head and for receiving signals from the probe head, basically as they are known to the skilled person.

Tube 12 is advantageously cylindrical, and it has a tube axis 18.

To operate the device, tube 12 is inserted into the static magnet of an NMR device while base 10 remains outside it. Hence, in a direction perpendicular to tube axis 18, tube 12 has a smaller diameter than base 10.

Typically, the diameter of tube 12 perpendicular to tube axis 18 is approximately between 40 and 100 mm, in particular 40 mm, while the corresponding diameter of base 10 in at least one direction perpendicular to tube axis 18 is at least twice as large.

Figure 2:
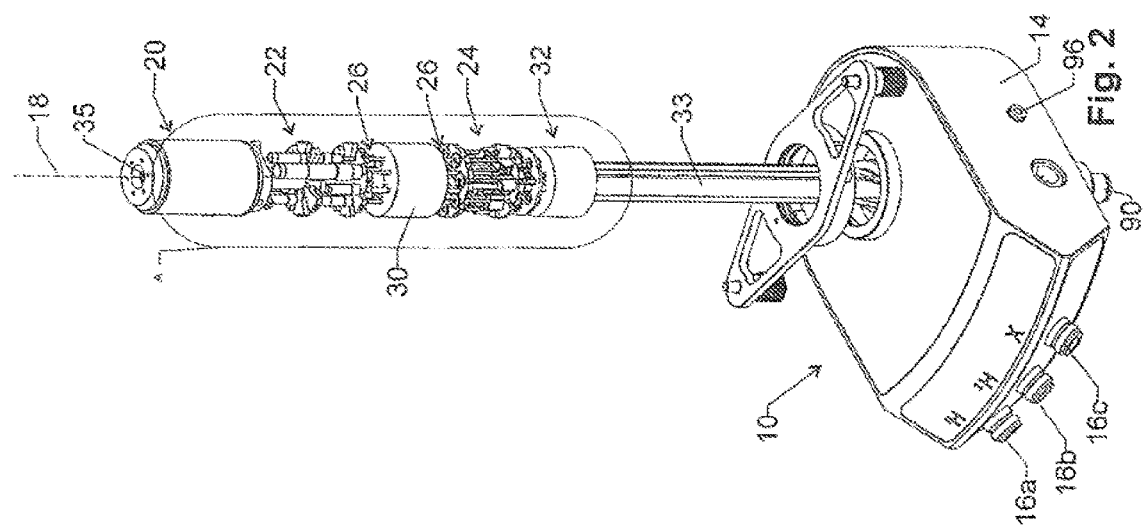
FIG. 2 shows the probe head of FIG. 1 with the tube removed.

Tube 12 is hollow and receives various components therein, such as shown in FIG. 2.

In particular, in the space surrounded by tube 12, there are at least part of the following components:
  a coil assembly 20,
  a tuning and matching circuit 22,
  an actuator assembly 24,
  an assembly 26 of actuation members 28,
  an RF sealing 30,
  a mounting member 32, and
  a centering member 33.

Figure 9:
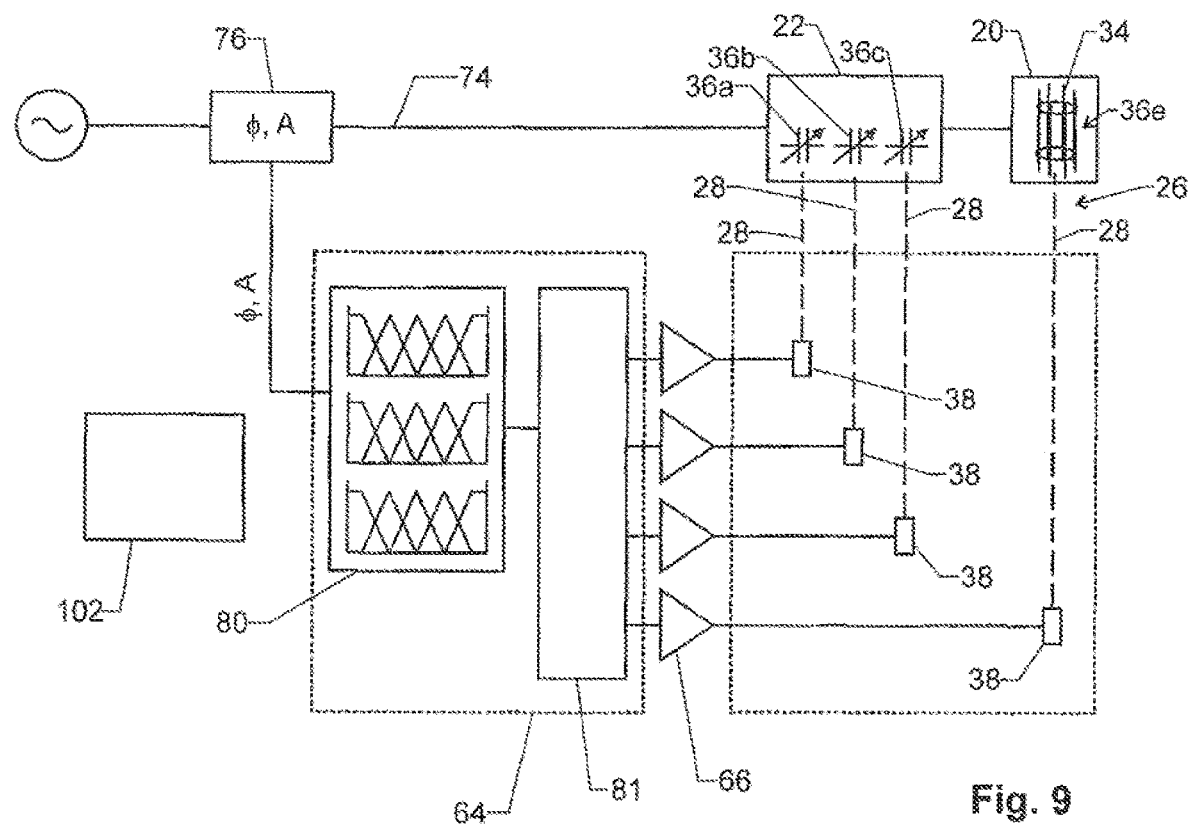
FIG. 9 shows a block circuit diagram of the NMR probe head.

Coil assembly 20 comprises one or more coils 34, e.g. as shown in FIG. 9 and it is structured and adapted to generate a magnetic pulse in the sample and to detecting the signals from the precessing spins or magnetization of the sample.

Coil assembly, tuning and matching circuit:

Coil assembly 20 comprises one or more coils 34, such as a birdcage coil as schematically shown FIG. 9. However, coil assembly 20 may also contain other coil types as known to the skilled person.

The coil or coils 34 of coil assembly 20 are arranged outside a sample chamber where the sample is received in a holder mounted to the NMR probe head. FIG. 2 shows the entry opening 35 to the sample chamber.

Tuning and matching circuit 22 is arranged close to the coil(s) of coil assembly 20 to the coil. It is provided for tuning the resonance of the coil(s) and adapt it to the power of the signals. The exact nature of its circuitry depends on the coils to be used and the nature of measurements to be carried out. Examples are e.g. shown in US 2008/0117560.

Tunable Elements:

Several tunable elements 36a-e (commonly designated by reference number 36) are arranged in tuning and matching circuit 22 and/or in coil 34. They are used for tuning and/or matching coil 34 and circuit 22 to the used signals. The tunable elements 36 can e.g. comprise adjustable capacitors, adjustable inductances, and/or electric switches. For example, they can be based on the technologies described in WO 2009/094040, US 2008/0117560, and/or U.S. Pat. No. 4,694,255.

Figure 3:
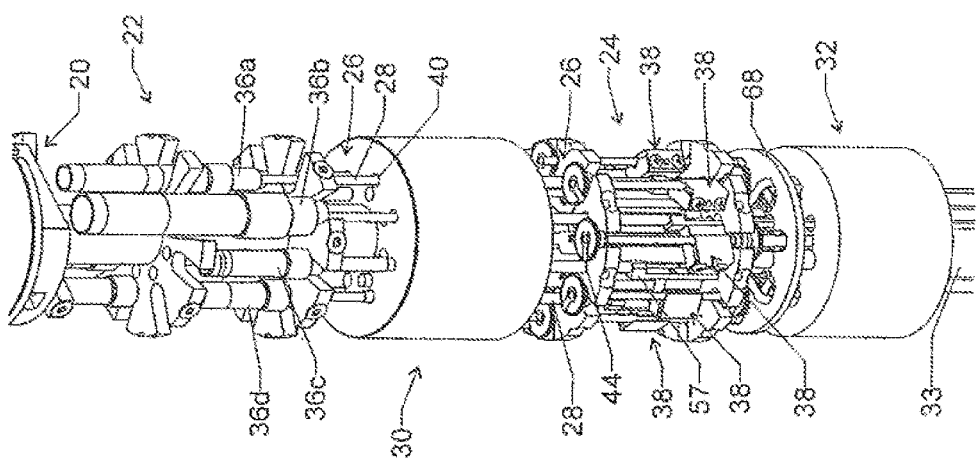
FIG. 3 shows an enlarged part of FIG. 2 (cf. section A of FIG. 2)

In the embodiment of FIGS. 2 and 3, the tunable elements 36 are e.g. tunable capacitors having a movable electrode arranged in an insulating cylinder, with one or more static electrodes arranged on the cylinder's outer surface, such as e.g. disclosed in US 2008/0117560.

The tunable elements 36 can be adjusted or operated mechanically. For this purpose, each one of them is connected to at least one mechanically displaceable actuation member 28.

Actuation:

In the embodiment of FIGS. 2 and 3, the actuation members are implemented as actuation rods.

Together the actuation members 28 form the actuation assembly 26. The actuation members 28 extend parallel to tube axis 18 of tube 12.

The actuator assembly 24 comprises a plurality of actuators 38 connected to the tuning elements 36 via the actuation members 28.

RF sealing 30 is basically a metal body arranged between the actuators 38 of actuator assembly 24 and tuning and matching circuit 22.

In order to minimize signal leak and to protect the actuators from reflected power, the actuator members 28 are of a non-metallic material and extend through openings 40 in RF sealing 30.

The design of actuator assembly 24 is described in more detail below.

Mounting:

Centering member 33 is connected to base 10 and extends axially along tube 12. Coil assembly 20 (and therefore coil 34), tuning and matching circuit 22, actuator assembly 24, RF sealing 30, and mounting member 32 are all centered on centering member 33.

Mounting member 32 mechanically contacts tube 12 and centers it on tube axis 18.

Advantageously, and in order to fit into tube 12, all components therein, such as actuator assembly 24, have, in all directions perpendicular to tube axis 18, a diameter of less than 100 mm, in particular of less than 40 mm.

Actuator assembly and actuators:

Actuator assembly 24 comprises, as mentioned, several actuators 38. Its design is best understood from FIGS. 4-7.

Actuator assembly 24 comprises a frame having a first frame body 42a and a second frame body 42b. The actuators 38 are commonly held in frame 42a, 42b.

First and second frame body 42a and 42b are spaced apart and centered on centering member 33. First frame body 42a, which is closer to matching and tuning circuit 22 than second frame body 42b, comprises opening or recesses 44, through which the actuation members 28 extend (cf. FIG. 3).

Figure 7:
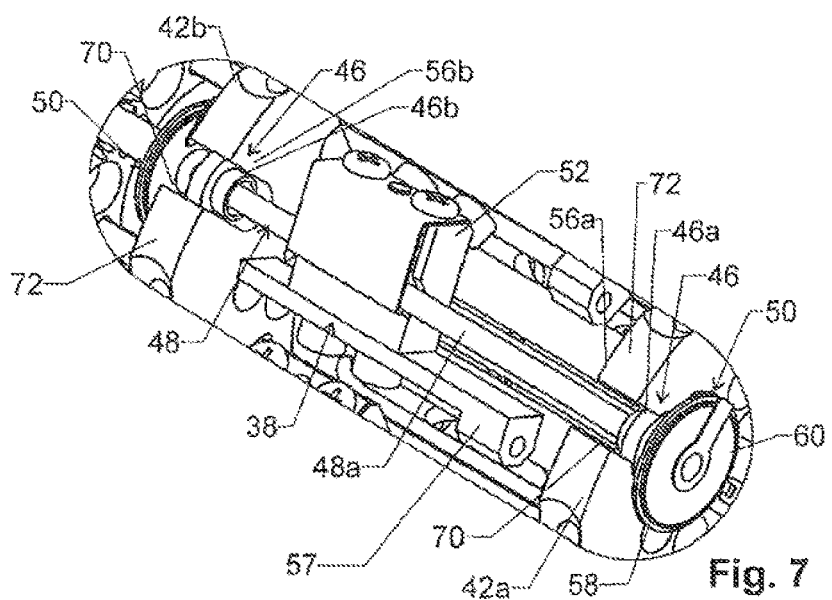
FIG. 7 shows an enlarged part of FIG. 6 (cf. section B of FIG. 6)

As best seen in FIG. 7, each actuator 38 comprises:

A mount 46 fixedly connected to tube 12 (fixedly in the sense that, during operation of the actuator, tube 12 does not move in respect to the mount).

A driving rod 48 elastically mounted on mount 46.

At least one piezoelectric element 50 mounted to driving rod 48.

A slip coupler 52 arranged on the driving rod. Slip coupler 52 is connected to one of the actuation members 28.

In the embodiment shown, mount 46 comprises a first elastic holder 46a and a second elastic holder 46b for mounting driving rod 48 to first frame body 42a and second frame body 42b, respectively.

For example, the elastic holders 46a, 46b can be made from an elastic material, such as a polymer or a metal spring. Advantageously, the elastic holders 46a, 46b can formed by a glue with a shore-A hardness between 50 and 60, or they can e.g. be an elastomer body.

First and second elastic holder 46a, 46b are arranged at a distance from each other with a section 48a of driving rod 48 extending between them. Slip coupler 52 is mounted to this section 48a.

First and second frame body 42a, 42b form mechanical stops 56a, 56b limiting the movement of slip coupler 52 and therefore of the actuation members 28.

The stops 56a, 56b may interact with slip coupler 52 directly, or as shown, with a spacer 57 mounted to slip coupler 52.

Advantageously, there are at least two actuators 38 with spacers 57 as of differing lengths. This allows to use the same basic actuator design for tunable elements of differing size.

In the embodiment shown, there are a first and a second piezoelectric element 50 mounted to opposite ends of driving rod 48, which allows to obtain stronger oscillations within driving rod 48.

Each piezoelectric element 50 comprises a body 58 of a piezoelectric material and electrodes 60 applied thereto. Upon application of a voltage to the electrodes 60, body 58 deforms such that its center of mass is offset along the axis of driving rod 48. Hence, the application of the voltage generates a force acting along the axis of driving rod 48 and causing it to accelerate along its longitudinal axis. The elastic mounting in mount 46 allows for respective longitudinal movements as long as they are sufficiently small.

By e.g. applying sawtooth voltages or squarewave-voltages with asymmetric duty cycles to the electrodes 60, driving rod 48 can be excited to perform back-and-forth motions along its longitudinal axis, with the two motions having different acceleration rates. For example, the back-motion can have lower acceleration than the forth motion. By suitably dimensioning the grip of slip coupler 52 on driving rod 48, it can be made to slip during the motion with faster acceleration while remaining friction-locked during lower acceleration, which allows to move slip coupler 52 in a step-wise manner and therefore to displace actuation member 28 along a single direction.

An element of this type is e.g. disclosed in WO 2005/083874.

A control unit 64 and electric drivers 66, as shown in FIG. 9, can be used for generating the electrical voltages to be applied to the piezoelectric elements 50.

Figure 6:
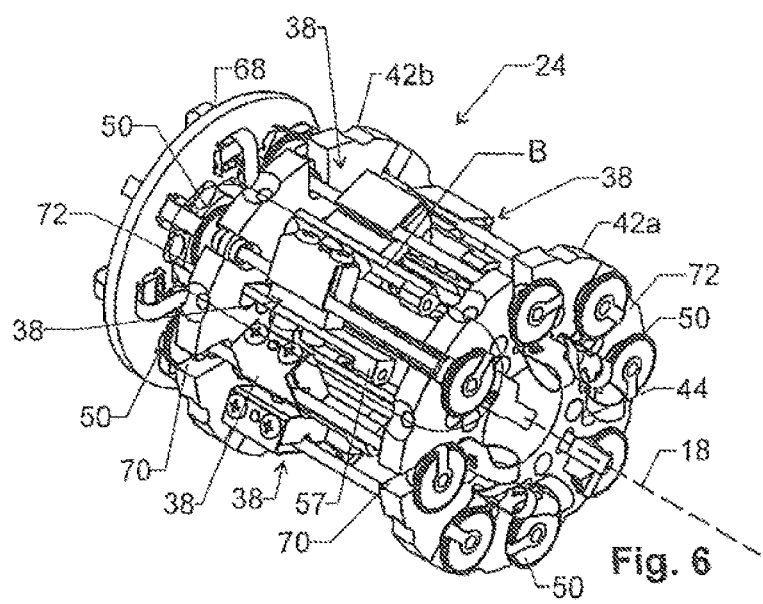
FIG. 6 shows a 3D view of the drive assembly.

As shown in FIG. 6, actuator assembly 24 can comprise an interface mount 68, such as a printed circuit board, providing a plug-interface connecting a multichannel feed cable from control unit 64 to actuator assembly 24 and for distributing the signals from the cable to the individual piezoelectric elements 50.

As best seen in FIG. 7, the elastic holders 46a, 46b are arranged between the slip coupler 52 (and section 48a of driving rod 48) at one side and the piezoelectric elements 50 at the other side.

The elastic holders 46a, 46b are arranged in recesses or openings 70 in first and second frame body 42a, 42b.

Advantageously, for easier mounting of the actuators, recesses 70 are provided extending inwards from an outer edge 72 (i.e. the edge facing away from tube axis 2) of first and/or second frame body 42a, 42b. In this case, first and/or second frame body 42a, 42b is/are a plate or plates extending transversally, in particular and as shown perpendicularly, to tube axis 18.

As best seen in FIG. 6, the driving rods 48 of the different actuators are advantageously arranged on a circle extending around tube axis 18, which allows for a compact design.

Further, and for the same reason, the driving rods 48 advantageously arranged parallel to tube axis 18.

Temperature Control:

The probe head comprises a temperature control for controlling the temperature within the sample chamber. This is illustrated in FIG. 8.

As can be seen, centering member 33 forms a tubular duct, which is arranged around a heating member 84. Heating member 84 comprises a tube 86 surrounding a heater 88 arranged in a temperature-controlled air duct 89. Temperature-controlled air duct 89 extends from base 10 to sample chamber 88.

Figure 8:
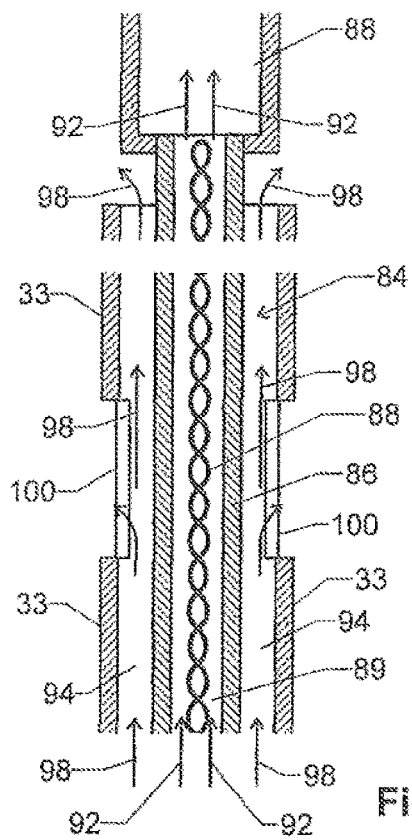
FIG. 8 shows a simplified sectional view of the centering member enclosing the heating member.

Tube 86 can be solid (as shown in FIG. 8) or it can e.g. also be a double-walled Dewar container for improved thermal insulation.

At the side of base 10, tube 86 is connected to a temperature-controlled air inlet 90 (see FIGS. 1 and 2), through which temperature-controlled air 92 (FIG. 8) is fed into temperature-controlled air duct 89. This temperature-controlled air is heated by heater 88 to a defined temperature, which can e.g. be in the range between −150 and +150° C. If a low temperature is desired in sample chamber 88, the temperature-controlled air can be cooled to a temperature below the desired temperature before it is fed to the probe head, and the heating member 84 can then be used to fine-adjust its temperature.

In order to prevent the heat generated by heating member 84 from heating up the other components of the probe head, and/or in order to prevent condensation if the temperature-controlled air is cold, centering member 33 forms an insulation air duct 94 around heating member 84 and temperature-controlled air duct 89. Further, base 10 comprises an insulation air inlet 96 (see FIGS. 1 and 2) for feeding dry insulation air 98 (FIG. 8) into insulation air duct 94. Insulation air 98 can be any suitable gas, such as air or nitrogen.

Figure 5:
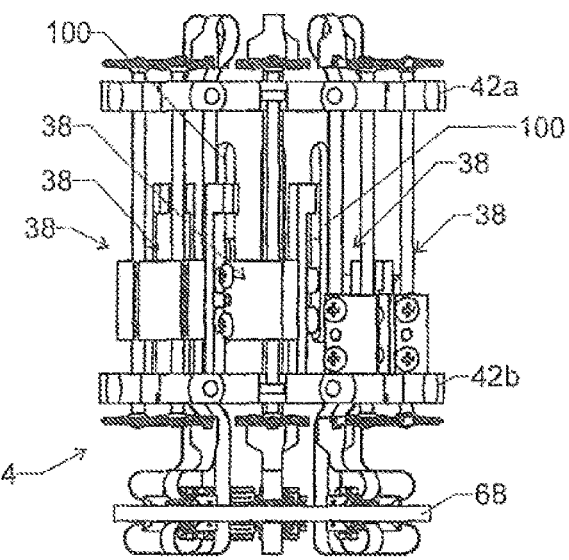
FIG. 5 shows the drive assembly of FIG. 1 in a view perpendicular to the tube axis.

Insulation air duct 94 can comprise lateral openings 100, in particular at the location of the actuators 38, e.g. radially inwards from the actuators, as shown in FIG. 5, for cooling the actuators 38 and/or other components of the probe head.

The probe head further comprises a temperature sensor arranged in sample chamber 88 and a temperature controller for operating heater 88 in order to maintain a desired temperature in sample chamber 88.

In addition, the probe head can be adapted and structured to cool the coil 34 as well as the tuning and matching circuit 22, in particular to cryogenic temperatures below −100° C., thereby enhancing NMR sensitivity.

For this purpose, the probe head can e.g. comprise a cooling duct for feeding a cooled liquid or a gas to heat exchanger for cooling these components and insulation for thermally insulating them. Optionally, temperature sensors and a temperature control can be provided, as well as means for evacuating these components for improved thermal insulation. The respective elements are shown schematically under reference number 102 of FIG. 9.

Method of Operation:

As mentioned above, suitable signals can be used to excite the driving rods 48 into asymmetric forth-and-back motions, thereby displacing the slip couplers 52 along them. The slip couplers' 52 motion is limited by the stops 56a, 56b.

This can be exploited to accurately position the slip couplers 52 and therefore the actuation members 28 to a desired position even in the absence of a position detector.

To do so, control unit 64 can operate at least one of the actuators 38 to displace the actuation member 28 connected to it along a first direction for a given number of steps. The given number of steps is sufficient to ensure that the actuation member 28 is stopped by one of the mechanical stops 56a, 56b at an end position. This allows to bring the actuation member 28 into a defined position even if no position detector is available.

If, for example, the maximum displacement of actuation member 28 is M, and the displacement achieved in a single step is d, the given number n of steps 20 is at least M/d.

After executing the given number of steps, control unit 64 can operate the actuator to move the actuation member 28 from the end position into a second direction opposite the first direction for a second number of steps of the actuator 38 in order to reach a desired position. This second number of steps may not necessarily bring the actuator to the correct position where tuning and matching is perfect. Rather, control unit 64 can then fine-tune the tuning and matching circuit as described in the following.

As shown in FIG. 9, the probe head further can comprise the following components:

A signal line 74 for feeding an AC signal to tuning and matching circuit 22.

A detector 76, such as a network analyzer, for detecting the magnitude and phase of the signal on signal line 74.

An analyzer, in particular a fuzzy logic unit 80, 81, for determining, from said magnitude and phase, the direction for displacing at least one of the actuation members in order to adjust the tunable elements in order to tune and/or match the device.

The details of such a matching and tuning method are described in U.S. Pat. No. 5,842,154. It is based on the understanding that the simultaneous knowledge of the phase and magnitude of the signal on the signal line 74 allows to determine the direction of adjustment of the tunable elements.

Advantageously, and as described in U.S. Pat. No. 5,842,154, the analyzer comprises a fuzzy logic unit having a fuzzification unit 80 as well as a rule evaluation and defuzzification unit 81 for determining the direction of displacement.

Notes:

In the embodiments above, the actuation members 28 are actuation rods. i.e. rigid rods connecting the actuators 38 to the tunable elements 36.

Alternatively, the actuation members 28 can e.g. be Bowden cables or Bowden wires, advantageously of a non-metallic material, such as glass fibers.

In the embodiment above, two piezoelectric elements 50 are connected to each driving rod 48. Depending on the strength of the mechanical oscillations required, a single piezoelectric element 50 per driving rod 48 may suffice.

As mentioned, the tunable elements 36 can be part of the coil and/or part of the tuning and matching circuit 22. In particular, the tunable elements 36 can all be part of the tuning and matching circuit 22.

In any case, the design shown here allows to integrate a large number of tunable elements in the tube 12 and to adjust them quickly and reliably.

In the embodiments above, all the actuators are piezoelectric actuators. However, some of the actuators may also include other types of actuators, such as at least one of the group of electric actuators (i.e. actuators based on electromagnetic motors), pneumatic actuators, and hydraulic actuators.

Advantageously, though, at least a plurality of the actuators are piezoelectric actuators.

While there are shown and described presently preferred embodiments of the invention, it is to be distinctly understood that the invention is not limited thereto but may be otherwise variously embodied and practiced within the scope of the following claims.

The invention claimed is:

1. An NMR probe head comprising
   a base,
   a tube having a diameter smaller than said base,
   a coil arranged within said tube and surrounding a sample chamber,
   a tuning and matching circuit arranged within said tube and connected to said coil,
   several tunable elements arranged in said tuning and matching circuit and/or said coil,
   several actuators mechanically connected by means of actuation members to said tunable elements,
   wherein at least some of said actuators are piezoelectric actuators and
   wherein at least one of said actuators comprises
   a mount fixedly arranged in respect to said tube,
   at least one driving rod elastically mounted on said mount,
   at least one piezoelectric element mounted to said driving rod,
   a slip coupler arranged on said driving rod, wherein at least one of said actuation members is connected to said slip coupler.

2. The NMR probe head of claim 1, wherein said actuators are located within said tube between said base and said tuning and matching circuit.

3. The NMR probe head of claim 1 wherein at least one of said actuation members is an actuation rod extending between its actuator and its tunable element.

4. The NMR probe head of claim 1 wherein said actuation members extend parallel to a tube axis of said tube.

5. The NMR probe head of claim 1, wherein said driving rod is lighter, in particular shorter, than said actuation members.

6. The NMR probe head of claim 1, wherein said mount comprises a first elastic holder and a second elastic holder arranged at a distance from each other, wherein said slip coupler is mounted to a section of said driving rod extending between said first and said second holder.

7. The NMR probe head of claim 6, wherein said one of said elastic holders is arranged between said slip coupler and said at least one piezoelectric element.

8. The NMR probe head of claim 1, wherein said actuator comprises a first and a second piezoelectric element mounted to opposite ends of said driving rod.

9. The NMR probe head of claim 1, having an actuator assembly, wherein said actuator assembly comprises several of said actuators, wherein said actuator assembly comprises a frame commonly holding said actuators.

10. The NMR probe head of claim 9, wherein said frame comprises at least one frame body having a plurality of recesses or openings, wherein each of said driving rods is held in at least one of said recesses or openings.

11. The NMR probe head of claim 10, wherein said actuator assembly comprises, for each of said recesses or openings, an elastic holder adapted and structured to elastically hold one driving rod in said recess or opening.

12. The NMR probe head of claim 10 wherein frame body is a plate extending transversally, in particular perpendicularly, to an axis of said tube and wherein said recesses or openings are recesses extending inwards from an outer edge of frame body.

13. The NMR probe head of claim 10, wherein said frame comprises a first and a second frame body arranged at a distance from each other, wherein the driving rods of said actuators extend between the two frame bodies.

14. The NMR probe head of claim 10, wherein said actuation members extend through said frame body.

15. The NMR probe head of claim 9 wherein said actuator assembly has, in any direction perpendicularly to a tube axis of said tube, a diameter smaller than 100 mm, in particular smaller than 40 mm.

16. The NMR probe head of claim 9 wherein the driving rods of said actuator assembly are arranged on a circle.

17. The NMR probe head of claim 9, comprising a centering member extending axially along said tube, wherein said coil, said tuning and matching circuit, and said actuator assembly are centered by said centering member.

18. The NMR probe head of claim 1 wherein said driving rod extends parallel to a tube axis of said tube.

19. The NMR probe head of claim 1, wherein said actuator is structured and adapted to displace said actuation member in respect to said piezoelectric element.

20. The NMR probe head of claim 1 adapted and structured to cool said coil and said tuning and matching circuit, in particular to a temperature below 100° C.

21. The NMR probe head of claim 1 further comprising a heating member comprising a heater arranged in a temperature-controlled air duct, wherein said temperature-controlled air duct extends from said base to said sample chamber.

22. The NMR probe head of claim 21, further comprising an insulation air duct arranged around said heating member and said temperature-controlled air duct, and in particular wherein said insulation air duct comprises lateral openings for cooling said actuators—and/or other components of the probe head.

23. The NMR probe head of claim 17 further comprising an insulation air duct arranged around sais heating member and said temperature-controlled air duct, and in particular wherein said insulation air duct comprises lateral openings for cooling said actuators and/or other components of the probe head,
   wherein said insulation air duct is formed by said centering member.

24. The NMR probe head of claim 1 wherein said tunable elements comprise at least one of the group of adjustable capacitors, adjustable inductors, and electric switches.

25. The NMR probe head of claim 1, comprising an RF sealing arranged between said actuators and said adjustable elements, wherein said actuation members are of a non-metallic material and extend through openings in said RF sealing.

26. The NMR probe head of claim 1 further comprising
mechanical stops arranged to limit a movement is said actuation members,
a control unit electrically connected to said actuators, wherein said control unit is adapted and structured to operate at least one of said actuators to displace the actuation member connected to it along a first direction for a given number of steps, wherein said given number of steps is sufficient to ensure that said actuation member is stopped at an end position by a first one of said mechanical stops.

27. The NMR probe head of claim 25, wherein said control unit is adapted and structured to operate said at least one actuator to move said actuation member after said given number of steps from said end position into a second direction opposite said first direction for a given number of oscillations of said actuator.

28. The NMR probe head of claim 1 further comprising
a signal line for feeding an AC signal to said tuning and matching circuit and a detector for detecting a magnitude and phase of said signal on said signal line,
an analyzer for determining, from said magnitude and phase, a direction for displacing at least one of said actuation members, and in particular wherein said analyzer comprises a fuzzy logic unit.

29. A method for operating the NMR probe head of claim 1, comprising the step of operating at least one of said actuators to displace the actuation
member connected to it along a first direction for a given number of steps, wherein said given number of steps is sufficient to ensure that said actuation member is stopped by a mechanical stop at an end position.

30. The method of claim 29, further comprising the step of operating said at least one actuator to move said actuation member after said given number of steps from said end position into a second direction opposite said first direction for a given number of oscillations of said actuator for reaching a desired position.

31. The method of claim 29, comprising the steps of
measuring a magnitude and phase of an AC signal being fed to said tuning and matching circuit, and
determining, from said magnitude and phase, a direction for displacing at least one of said actuation members, in particular using fuzzy logic.

* * * * *